(12) United States Patent
Carvalho et al.

(10) Patent No.: US 11,764,782 B2
(45) Date of Patent: Sep. 19, 2023

(54) MOTOR VEHICLE CONTROL DEVICE

(71) Applicant: BCS AUTOMOTIVE INTERFACE SOLUTIONS GMBH, Radolfzell (DE)

(72) Inventors: Nelson Carvalho, Aach (DE); Pawel Borowczyk, Czestochowa (PL); Steffen Sornberger, Hilzingen/Twiefeld (DE); Helmut Sowig, Villingen-Schwenningen (DE); Viktor Beliuzhenko, Constance (DE); Leandro Conde, Singen (DE)

(73) Assignee: BCS AUTOMOTIVE INTERFACE SOLUTIONS GMBH, Radolfzell (DE)

( * ) Notice: Subject to any disclaimer, the term of this patent is extended or adjusted under 35 U.S.C. 154(b) by 487 days.

(21) Appl. No.: 16/623,802

(22) PCT Filed: Jun. 20, 2018

(86) PCT No.: PCT/EP2018/066373
§ 371 (c)(1),
(2) Date: Dec. 18, 2019

(87) PCT Pub. No.: WO2018/234362
PCT Pub. Date: Dec. 27, 2018

(65) Prior Publication Data
US 2021/0143818 A1    May 13, 2021

(30) Foreign Application Priority Data
Jun. 21, 2017  (DE) .................... 10 2017 113 660.6

(51) Int. Cl.
*H03K 17/96* (2006.01)
*B60K 35/00* (2006.01)
(Continued)

(52) U.S. Cl.
CPC ........... *H03K 17/962* (2013.01); *B60K 35/00* (2013.01); *B60R 16/005* (2013.01);
(Continued)

(58) Field of Classification Search
CPC ...... H03K 17/962; H03K 17/96; B60K 35/00; H01H 21/30; H01H 23/02; H01H 3/02;
(Continued)

(56) References Cited

U.S. PATENT DOCUMENTS 6,373,265 B1    4/2002  Morimoto et al.
6,657,140 B2    12/2003 Rantet
(Continued)

FOREIGN PATENT DOCUMENTS

DE    102015116290     3/2016
DE    202016001741 U1  6/2016
GB    1223099          2/1971

*Primary Examiner* — Lheiren Mae A Caroc
*Assistant Examiner* — Iman Malakooti
(74) *Attorney, Agent, or Firm* — McNees Wallace & Nurick LLC

(57) ABSTRACT

There is described a motor vehicle control device (10) with a control unit (12), which includes a movable control element (14), and an electrode carrier (20) which comprises at least two electrodes (24) associated to the control element (14), which are contacted electrically and together with the control unit (12) form a common capacitor (38).

18 Claims, 6 Drawing Sheets

(51) Int. Cl.
  *B60R 16/00* (2006.01)
  *B60R 16/023* (2006.01)
  *G06F 3/044* (2006.01)
  *H01H 21/30* (2006.01)

(52) U.S. Cl.
  CPC .......... *B60R 16/0231* (2013.01); *G06F 3/044* (2013.01); *H01H 21/30* (2013.01); *B60K 2370/46* (2019.05); *B60K 2370/48* (2019.05); *B60K 2370/52* (2019.05); *H03K 2217/96015* (2013.01)

(58) Field of Classification Search
  CPC ... H01H 2239/006; G06F 3/044; B60R 16/00; B60R 16/023
  USPC .......................................... 200/339, 529, 600
  See application file for complete search history.

(56) References Cited

U.S. PATENT DOCUMENTS

| | | | |
|---|---|---|---|
| 6,794,592 B1* | 9/2004 | Liu | H01H 23/06 |
| | | | 200/339 |
| 6,930,269 B1* | 8/2005 | Lee | H01H 23/205 |
| | | | 200/553 |
| 10,340,102 B2 | 7/2019 | Bleckmann et al. | |
| 2010/0148999 A1 | 6/2010 | Casparian et al. | |
| 2014/0002358 A1 | 1/2014 | Bruwer | |
| 2014/0139450 A1 | 5/2014 | Levesque et al. | |
| 2014/0320200 A1* | 10/2014 | Dohi | H03K 17/962 |
| | | | 327/517 |
| 2016/0156353 A1* | 6/2016 | Tachiiri | H03K 17/962 |
| | | | 200/600 |
| 2018/0004306 A1 | 1/2018 | Ebisui et al. | |

\* cited by examiner

MOTOR VEHICLE CONTROL DEVICE

RELATED APPLICATIONS

This application filed under 35 U.S.C. § 371 is a national phase application of International Application Number PCT/EP2018/066373, filed Jun. 20, 2018, which claims the benefit of German Application No. 10 2017 113 660.6 filed Jun. 21, 2017, the subject matter of which are incorporated herein by reference in their entirety.

BACKGROUND

This invention relates to a motor vehicle control device.

From the prior art motor vehicle control devices are known, which for example are formed as a window lifter module. Usually, such motor vehicle control devices comprise a control element which is formed as a rocker or toggle switch. The corresponding control element is adjusted into a desired position by a vehicle occupant, in order to initiate a function such as "open window" or "close window". The used control elements usually are formed in a mechanical way, so that the lever movement is transmitted mechanically, in order to mechanically actuate associated switching elements to which the corresponding function is associated.

In modern motor vehicle control devices it furthermore is known that capacitive control elements are used for other fields of use, for example as On/Off switch of an air conditioning system or other assemblies. In general, the capacitive control elements have a lower wear than mechanical control elements, as no mechanical movement is required. The capacitive control elements also are formed such that they recognize a touch or in certain embodiments even an approach of a control object to the corresponding control element and execute a corresponding function. The capacitive control elements typically are formed as self-capacitive sensors or as mutually capacitive sensors. There are also capacitive control elements which are formed as distance or pressure sensors. Such capacitive sensors comprise two capacitor plates between which an electric field is formed, wherein an actuation results in a change in distance, whereby the electric field is changed, which is detected correspondingly. These capacitive control elements are useful in particular for safety-relevant functions.

However, it was found to be disadvantageous to use capacitive control elements, in case the control elements should be movable in addition, as this is the case for example with rocker or toggle switches which are used in window lifter modules. This is due to the fact that contacting of the two control portions acting as capacitor plates is difficult, in case the control element consists of a moving part.

SUMMARY

It is the object of the invention to provide a simply formed motor vehicle control device which includes a movable, capacitive control element.

According to the invention this object is solved by a motor vehicle control device, comprising a control unit which includes a movable control element, and an electrode carrier which comprises at least two electrodes associated to the control element, which are contacted electrically and together with the control unit form a common capacitor.

It is the idea underlying the invention that the motor vehicle control device comprises a capacitor whose electric potential is provided via the electrodes which are arranged on the common electrode carrier. It thereby is avoided that the movably formed control element itself must be contacted electrically, which correspondingly would make the construction and the assembly of the control unit more difficult. Hence, no movable parts must be contacted electrically in the control unit, which correspondingly reduces the manufacturing effort, although a movable control element is provided, which correspondingly is actuated for switching, as this is common practice for example in a window lifter module.

In particular, a switching symbol on an actuating portion of the control element can be backlit in that light impinges on the back of the actuation portion which is formed at least partly transparent.

In other words, the movable control element forms part of a common capacitor and includes at the same time one switching symbol which is adapted to be backlit.

One aspect provides that the two electrodes and the control unit form a capacitor flipped open. Consequently, the two capacitor plates lying on a different potential are formed by the two electrically contacted electrodes, so that an electric field is formed between the two electrodes, which is passed over the at least partly electrically conductive control element. In so far, this is a capacitor flipped open, as the electrodes lie in a common plane. The electric field formed between the different potentials of the electrodes merely is correspondingly deflected via the control unit.

A further aspect provides that the control unit and the electrode carrier form a capacitive sensor, in particular a capacitive sensor which is formed as pressure sensor or distance sensor. Correspondingly, a change of the distance of the control unit to the electrodes is detected, in order to infer a switching position. A mechanical change in position of the control element hence results in a change of the formed capacitor. Consequently, the electric field built up by the electrodes is changed correspondingly due to the change in position of the control unit relative to the electrodes, which can be detected, in order to recognize the actuation of the control unit by a vehicle occupant, i.e. of the control element of the control unit.

In general, the sensitivity of the capacitive sensor can be increased correspondingly due to the capacitor flipped open, as a change in distance of the control unit relative to the electrodes has a double effect on the change of the electric field. This is due to the fact that both the distance from the first electrode to the control unit and the distance from the control unit to the second electrode are changed correspondingly.

In particular, the control element comprises electrically conductive material. The control element as part of the control unit hence can cooperate with the electrodes, in order to form the capacitor flipped open. In addition, an approach of a control object to the control element can be detected thereby, as this results in a corresponding change of the electric field formed by the capacitor.

One embodiment provides that the control element is formed by a two-component injection molding method. In so far, the electrically conductive material can have been incorporated during the manufacture of the control element. The at least partly electrically conductive control element thereby can be manufactured easily and at low cost.

According to a further aspect the control unit comprises a resetting member which sets the control element back into its neutral position. The resetting member accordingly ensures that the actuated control element returns into its starting or neutral position.

According to a further aspect the resetting member is arranged between the electrode carrier and the control element. The resetting member accordingly is compressed by the control element, which is mechanically movable, in case a user, for example a vehicle occupant, correspondingly actuates the control element. In addition, the resetting member protects the electrode carrier, as in the case of an excessive actuation the control element does not directly contact the electrode carrier.

In particular, the resetting member is elastic and/or electrically conductive. The control element hence can be set back into its neutral position several times, as the resetting member is not plastically deformed. In case no more force is exerted on the control element by a user of the motor vehicle control device, which force is transmitted to the resetting member, the resetting member returns into its starting condition, wherein it likewise sets the control element back into its starting position. When a force is excessively exerted on the control element, the resetting member correspondingly is compressed more strongly, whereby the electrode carrier is protected correspondingly.

The electric conductivity of the resetting member also ensures that together with the electrodes it can form the common capacitor flipped open. In case a force is exerted on the electrically conductive resetting member via the control element, the same changes its position or bends, whereby the electric field of the common capacitor flipped open is changed, which is detected correspondingly.

In addition, a potential applied to the control element, for example due to a control object such as a finger, can be transmitted or forwarded up to the resetting member, in case the control element likewise is (at least partly) electrically conductive. Consequently, an approach to the control element can be detected correspondingly, which approach results in a characteristic change of the electric field, so that it is recognizable.

In particular, the electrode carrier is a printed circuit board. Accordingly, further components can be arranged on the electrode carrier, for example light sources or further electrodes, which are provided for other control areas.

According to a particular embodiment the control element is a rocker switch or a toggle switch. Consequently, the motor vehicle control device is a window lifter module which is provided for opening and closing one or more windows. The control element formed as rocker or toggle switch can be adjusted by a vehicle occupant in a simple way, as is known for rocker or toggle switches, in order to achieve the desired functions. However, no electrical contacts are mechanically contacted here, as merely the capacitance of a jointly formed capacitor is changed. Accordingly, the contacts are not worn mechanically.

For example, four electrodes are associated to the one control element, so that two common capacitors flipped open can be formed, which each are part of a corresponding capacitive sensor. The movable control element can be pivoted in two different directions due to a pivot axis, so that it can take two switching positions to which different functions are associated, which are detected correspondingly. For example, these are the functions "open window" and "close window".

In particular, the control element includes a pivot axis which is shifted with respect to the center-of-gravity axis of the control element, so that they do not intersect. In case the control element is formed for example as a rocker or toggle switch, it can be pivoted about a corresponding pivot axis. As the pivot axis is shifted with respect to the center-of-gravity axis of the control element, i.e. the center of gravity of the control element does not lie on the pivot axis, it is ensured that an inadvertent adjustment of the control element into one of the two positions is made more difficult. This position can be associated to the more safety-relevant function "close window", so that it can be excluded that the window is closed inadvertently, for example when the hand or another object should press on the control element. Due to the shifted pivot axis the control element in case of doubt is urged into the other position which is less safety-relevant, i.e. the position associated to the function "open window".

A further aspect provides that the motor vehicle control device comprises at least one further control area. The further control area can be a capacitive control area to which at least one function is associated, which can be activated due to a touch or an approach. The further function can relate to folding in and out of the side-view mirrors, heating of the side-view mirrors and to the mirror adjustment in general.

According to one aspect, the further control area is formed as a capacitive sliding area. The further control area accordingly is equipped to recognize a sliding movement of a control object, for example of a finger, on the corresponding capacitive sliding area and convert the same into an associated function. The capacitive sliding area can be provided to activate a function "open window". The vehicle occupant slides his/her finger over the sliding area, which is detected correspondingly. The vehicle occupant need not touch the sliding area, as an approach of the corresponding control object and a (spaced) sliding movement likewise are recognized.

According to a further embodiment the further control area is a capacitive function display control area, which comprises a display surface, wherein the function display control area is associated to a base module. On the function display control area, in particular on its display surface, selected functions can be optically displayed. It also is possible to select or actuate functions via the capacitively formed function display control area, in that the display surface is actuated correspondingly via a control object, for example a finger. The capacitive function display control area can be formed as a trim which is mounted on a base module formed as base body.

In particular, the base module comprises at least one electrically conductive portion which extends through the base module, wherein the electrically conductive portion has a sensor surface associated to the display surface, which forms at least a part of a capacitive sensor. The capacitive sensor, which is formed via the base module and the function display control area, can be an approach or touch sensor. For example, the capacitive sensor is formed such that in the case of an approach a first function and in the case of a touch a second function are performed. The approach to the capacitive sensor can switch on a search illumination, whereas touching of the capacitive sensor results in a corresponding function being switched on or off.

Furthermore, the at least one electrically conductive portion can be formed closed all around in one plane and surround a light duct which extends vertically through the base module like the at least one electrically conductive portion. The electrically conductive portion closed all around in the plane can be formed by the sensor surface. It thereby is ensured that a switching symbol formed on the display surface can be associated to a light source which backlights the corresponding switching symbol provided on the display surface through the base module, so that a vehicle occupant easily can find the same in the case of a search illumination. A compact construction thereby is created, which can be realized in a simple way, in order to backlight the switching symbols. The switching symbols for example are illuminated, when a search illumination is activated. Further light ducts can be associated to light exit surfaces, via which an activated function is optically displayed, for example via a light source correspondingly associated to the light exit surface, for example an LED. This light source can emit a characteristic (signal) color, for example red, so that the vehicle occupant quickly recognizes that the associated function is activated.

Furthermore, a search illumination can be associated to the function display control area, in particular to its display surface. The search illumination can be permanently switched on or be switched on due to an approach to the display surface and the related capacitive change, so that when a hand is guided over the function display control area the search illumination is switched on, in order to backlight the different switching symbols. As soon as the vehicle occupant touches a corresponding switching symbol on the display surface, a function associated to the switching symbol is executed, for example the function "retract mirror". The activated function then is optically displayed via a light exit surface associated to the switching symbol.

DESCRIPTION OF THE DRAWINGS

Further advantages and properties of the invention can be taken from the following description and the drawings to which reference is made. In the drawings.

DETAILED DESCRIPTION

Figure 1:
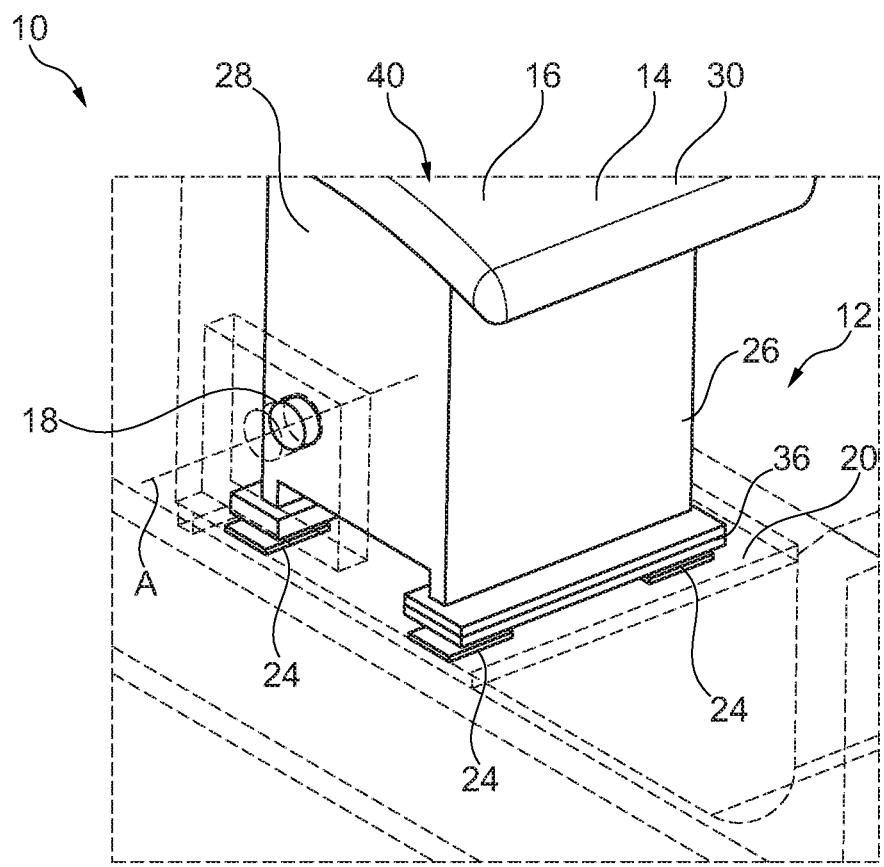
FIG. 1 shows a perspective view of a motor vehicle control device of the invention according to a first embodiment.

FIG. 1 shows a motor vehicle control device 10 in a partly transparent representation, which is used in a motor vehicle, for example as a window lifter module.

The motor vehicle control device 10 includes a control unit 12 which comprises a movable control element 14 in the form of a rocker or toggle switch 16.

The control element 14 is pivotally mounted on a bearing portion 18 of the motor vehicle control device 10, so that a corresponding pivot axis A is obtained for the control element 14, about which the control element 14 can correspondingly be pivoted in two opposite directions. The pivot axis A is shifted with respect to the center-of-gravity axis S of the control element 14, so that they do not intersect, as can be taken in particular from FIGS. 3 and 4. Consequently, the center of gravity of the control element 14 does not lie on the pivot axis A.

Furthermore, the motor vehicle control device 10 includes an electrode carrier 20 which is associated to the control unit 12. In the illustrated embodiment the electrode carrier 20 is formed as a printed circuit board 22 on which several electrodes 24 are provided. The electrodes 24 each in pairs are associated to a leg 26 of the control element 14 (see FIG. 1).

Figure 3:
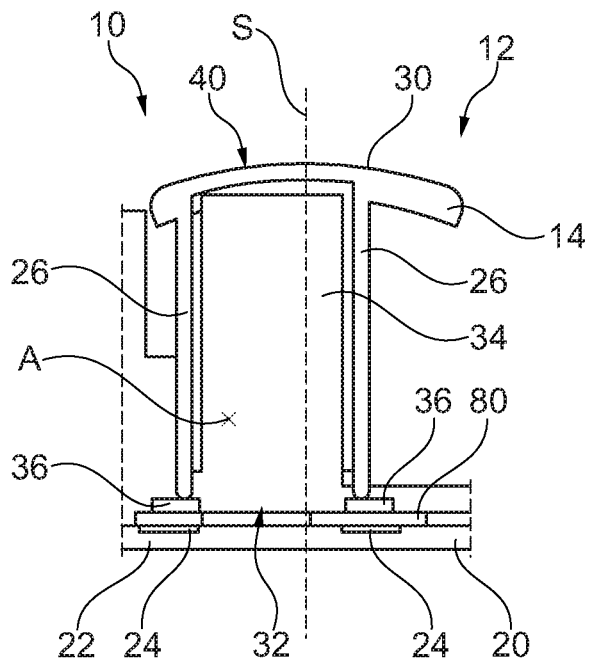
FIG. 3 shows a sectional view of the motor vehicle control device according to FIG. 1.
Figure 4:
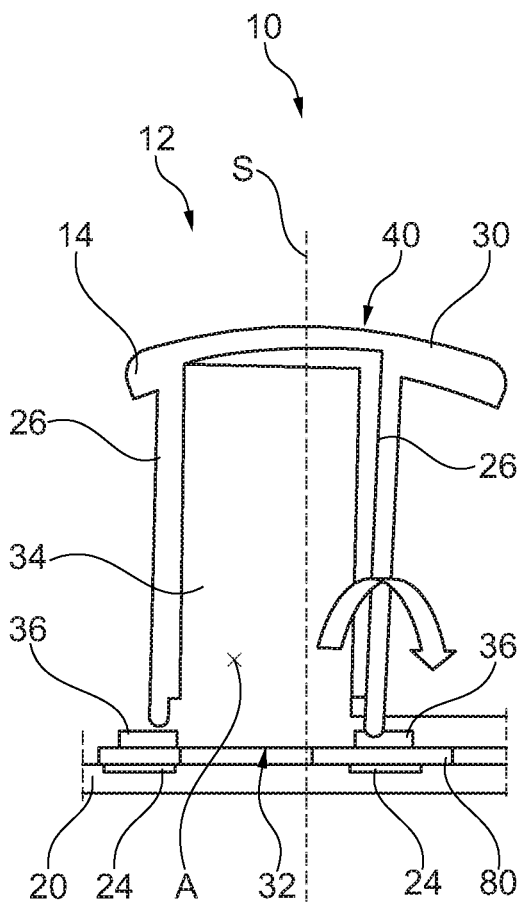
FIG. 4 shows a further sectional view of the motor vehicle control device according to FIG. 1.
Figure 5:
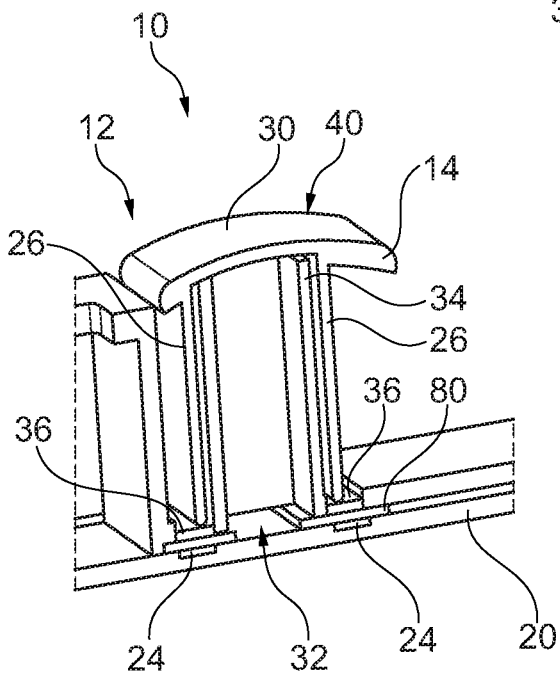
FIG. 5 shows a further sectional view of the motor vehicle control device according to FIG. 1.
Figure 6:
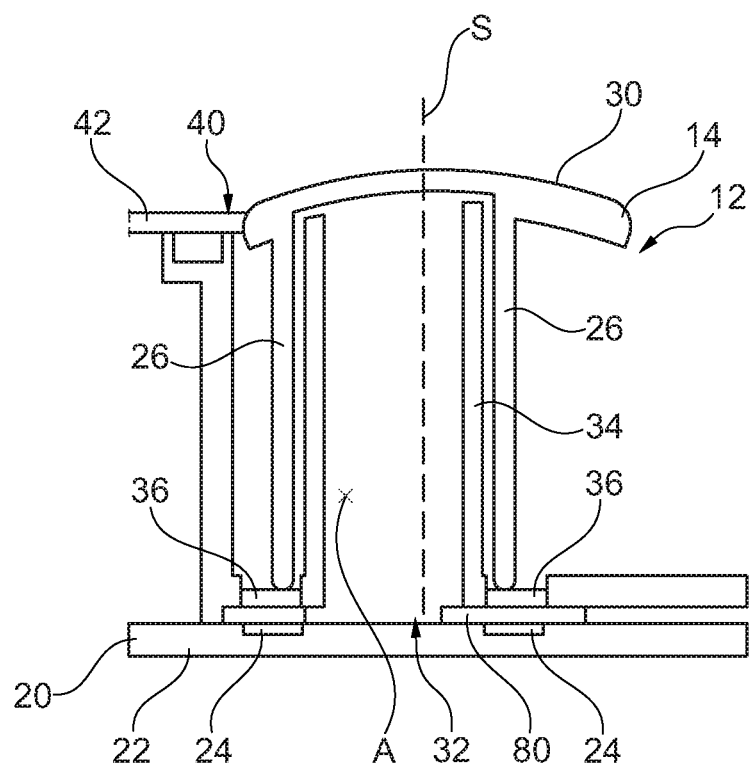
FIG. 6 shows a further sectional view of the motor vehicle control device according to FIG. 1.
Figure 7:
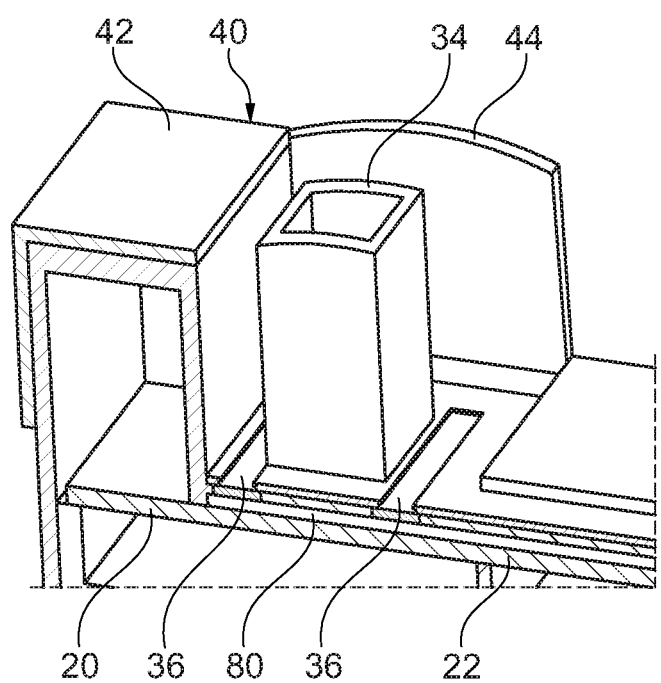
FIG. 7 shows a further sectional view of the motor vehicle control device according to FIG. 1.
Figure 8:
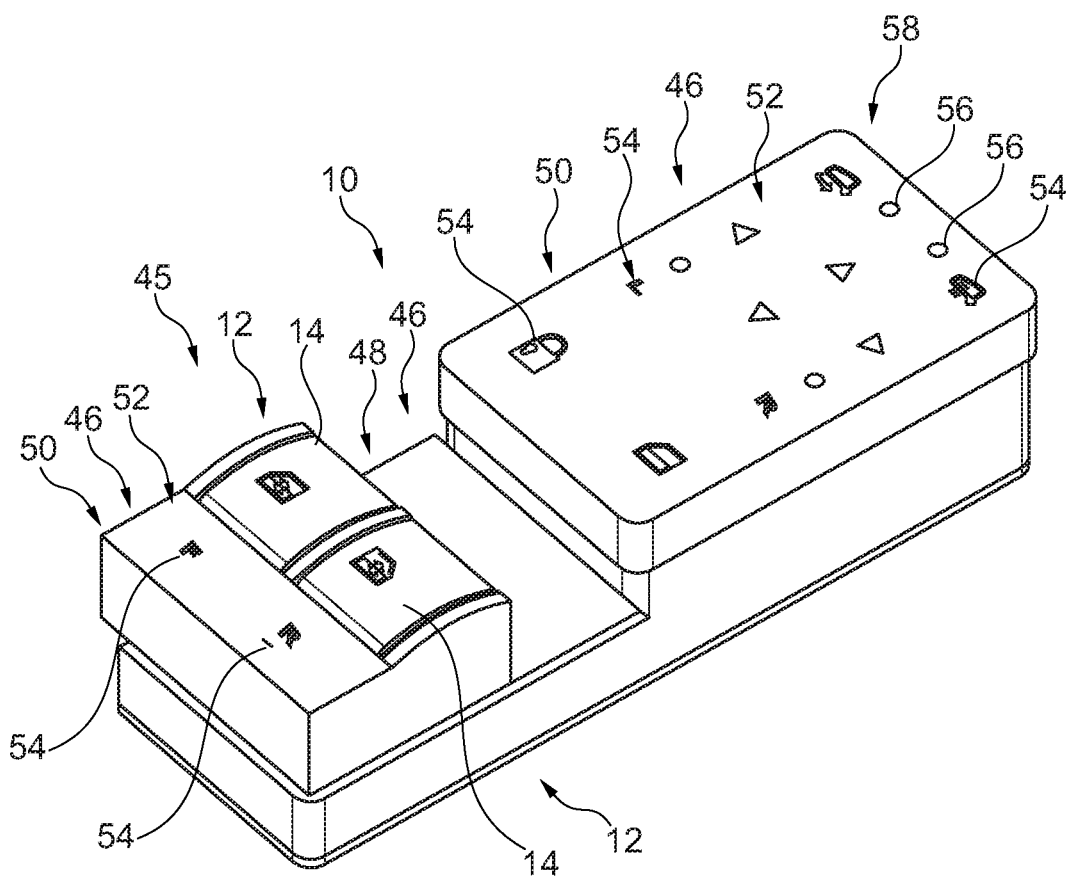
FIG. 8 shows a perspective view of a motor vehicle control device of the invention according to a second embodiment.
Figure 9:
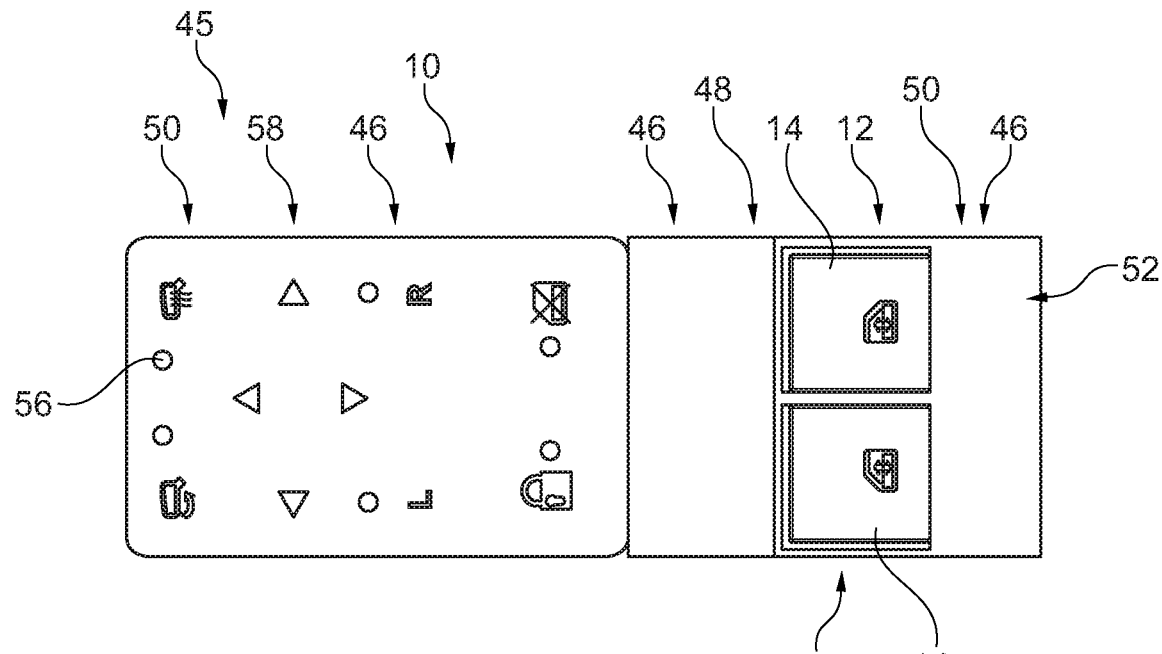
FIG. 9 shows a top view of the motor vehicle control device according to FIG. 8.

From FIGS. 3 to 5 in combination with FIG. 1 it can be taken that a total of four electrodes 24 are associated to the control unit 12, wherein two electrodes 24 each are associated to a first leg 26 and two other electrodes 24 are associated to a second leg 26 opposite the first leg 26. The two legs 26 each are connected with each other via side portions 28, via which the control element 14 is mounted in the associated bearing portion 18. In so far, the legs 26 extend substantially parallel to the pivot axis A.

The control element 14 also comprises an actuating portion 30 which is connected with the two legs 26 and the two side portions 28, wherein the actuating portion 30 forms a surface of the control element 14.

In general, the control element 14 is formed pot-shaped, so that it includes an opening 32 via which the control element 14 is put onto an in particular hollow guide pin 34 of the motor vehicle control device 10 such that the control element 14 is pivotable about the pivot axis A. This is illustrated in FIGS. 3 to 7.

By pivoting the control element 14 along the pivot axis A, the corresponding leg 26 is transferred into a switching position in which a function associated to the switching position is activated.

The legs 26 each press on an associated resetting member 36 which is part of the control unit 12. The resetting member 36 is arranged between the control element 14 and the electrode carrier 20, so that it correspondingly cooperates with the control element 14 in a mechanical way.

The resetting member 36 is formed elastic, so that it is compressed when the control element 14, in particular the corresponding leg 26, presses on the resetting member 36. As soon as the force exerted on the control element 14 decreases, the resetting member 36 returns into its original shape, whereby it likewise resets the control element 14 into its starting position.

Furthermore, the resetting member 36 is formed of an electrically conductive material, so that the resetting member 36 also can cooperate with the electrodes 24 on the printed circuit board 22 in an electrical way.

Figure 2:
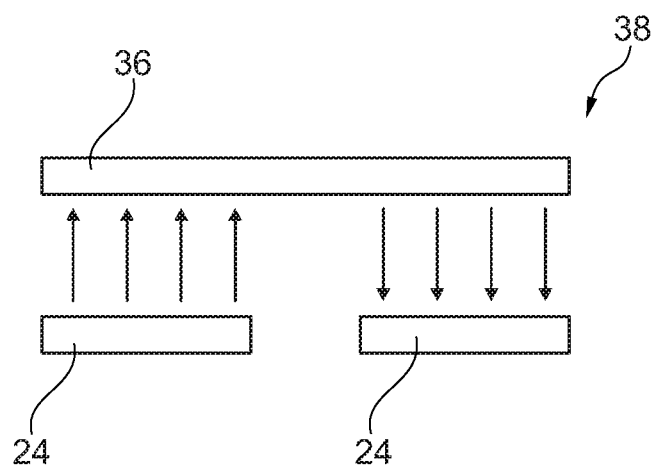
FIG. 2 shows a schematic representation of a capacitor provided in the motor vehicle control device according to FIG. 1.

The electrodes 24 of a pair together with the control unit 12, in particular with the resetting member 36, form a capacitor 38 flipped open, as is shown in the schematic representation of FIG. 2. The electrodes 24 each are electrically contacted via the printed circuit board 22, so that an electric potential can be applied to the electrodes 24. An electric field thereby is built up between the two electrodes 24, which is deflected via the electrically conductive resetting member 36.

In case the control element 14 is transferred from its neutral position, which is shown in FIG. 3, into a switching position, as shown in FIG. 4, the control element 14 presses on the associated resetting member 36 via the corresponding leg 26, which resetting member is compressed and bends.

The distance between the electrodes 24 and the resetting member 36 thereby is changed, whereby a change in capacitance of the capacitor 38 flipped open is obtained, which can be detected. Thereby, a corresponding switching position of the control element 14 or of the control unit 12 can be detected.

The capacitor 38 flipped open correspondingly forms a capacitive pressure sensor or a capacitive distance sensor, which detects a pressure exerted on the resetting member 36 or a change in distance related therewith.

Due to the capacitor 38 flipped open it is ensured that the movable control element 14 need not be contacted electrically, in order to form the capacitive sensor. This results in a distinctly simplified construction of the motor vehicle control device 10.

Due to the capacitor flipped open it also is ensured that there is an improved sensitivity of the capacitive sensor, as a change in distance of the resetting member 36 has a double effect on the electric field formed by the capacitor 38. The distance of an electrode 24 of the pair to the resetting member 36 and the distance from the resetting member 36 to the other electrode 24 of the pair substantially is changed equally when the control element 14 presses on the resetting member 36 and deforms the same.

The control element 14 itself also can comprise an electrically conductive material, in particular consist of the same. For example, the control element 14 has been manufactured by a two-component injection molding method.

As a result, a continuous electrical connection can be formed between the control element 14 and the resetting member 36, so that the capacitor 38 flipped open or the capacitive sensor formed thereby also is formed to detect an approach to the motor vehicle control device 10, in particular to the control element 14, as the electric field produced by the electrodes 24 thereby is changed. This change is characteristic such that it can be recognized as an approach to the motor vehicle control device 10.

The characteristic change for example can consist in that both capacitive sensors associated to the control element 14 at the same time detect a substantially equal change, i.e. the electric field produced by the two pairs of electrodes at the same time is changed in substantially the same way.

Due to a detected approach to the motor vehicle control device 10 a search illumination or another suitable function can be switched on, as will yet be explained below.

In particular, the motor vehicle control device 10 includes a continuous electrically conductive surface 40, as the control element 14 via its actuating portion 30 at least partly rests against a surface portion 42 of the motor vehicle control device 10 adjacent to the control element 14. This is illustrated for example in FIGS. 6 to 7.

The actuating portion 30 and the adjacent surface portion 42 are formed such that a corresponding swivel movement of the control element 14 nevertheless is possible.

The surface portion 42 is formed as a portion of a trim 44 which in general comprises several coherent surfaces, which altogether are coupled with each other in an electrical way, in order to create a large electrically conductive surface 40 of the motor vehicle control device 10. In particular an approach to the entire motor vehicle control device 10 can be detected thereby.

FIGS. 8 to 11 show a second embodiment of the motor vehicle control device 10 in various representations, which is formed as a window lifter module 45 which in the illustrated embodiment comprises two control units 12 of the type shown above. The two control units 12 are associated to the functions "close window" for a left and a right window. Furthermore, the two control units 12 also can be associated to the function "open window".

The motor vehicle control device 10 also comprises further control areas 46 which each are of the capacitive type. In particular further functions can be switched on and off thereby.

A first further control area 46 for example is formed by a capacitive sliding area 48, so that a sliding movement of a control object, for example of a finger of a vehicle occupant, is converted into a corresponding function. The corresponding function can be the function "open window", so that for example the functions "close window" and "open window completely" are associated to the control units 12. On the other hand, by a corresponding sliding movement via the sliding area 48 it can be adjusted how far the window is to be opened. Accordingly, a window can partly be opened via the window lifter module 45, in that the vehicle occupant slides his/her finger over the sliding area 48. The longer or farther the vehicle occupant moves his/her finger along the sliding area 48, the more the associated window is opened. The capacitive sliding area 48 can be formed as a touch or approach sensor area.

Furthermore, the window lifter module 45 comprises a second further control area 46 which is formed as a function display control area 50. The function display control area 50 likewise is of the capacitive type and comprises a display surface 52 on which several switching symbols 54 are shown, which can be backlit, as will yet be explained below.

On its display surface 52, the function display control area 50 also comprises several light exit surfaces 56 via which light can exit. In particular, the several light exit surfaces 56 are associated to particular switching symbols 54, in order to optically display an activated function switched via the switching symbol 54, which will yet be explained below.

The motor vehicle control device 10 also comprises a third further control area 46 which likewise is formed as a function display control area 50. The second function display control area 50 is associated to the control units 12, as by means of the same it can be adjusted for example whether the rear or front windows are to be operated via the control units 12. Accordingly, on the function display control area 50 there is likewise provided a display surface 52 on which corresponding switching symbols 54 can be represented, which on the one hand can be backlit and on the other hand can be operated capacitively, as will be explained below with respect to FIG. 10.

As explained above, an approach to the motor vehicle control device 10 can be detected, due to which a search illumination 58 is switched on, so that the vehicle occupant will have a better orientation on the motor vehicle control device 10. Via the search illumination 58 in particular the switching symbols 54 can be backlit, so that the vehicle occupant quickly recognizes where to activate which function.

Figure 10:
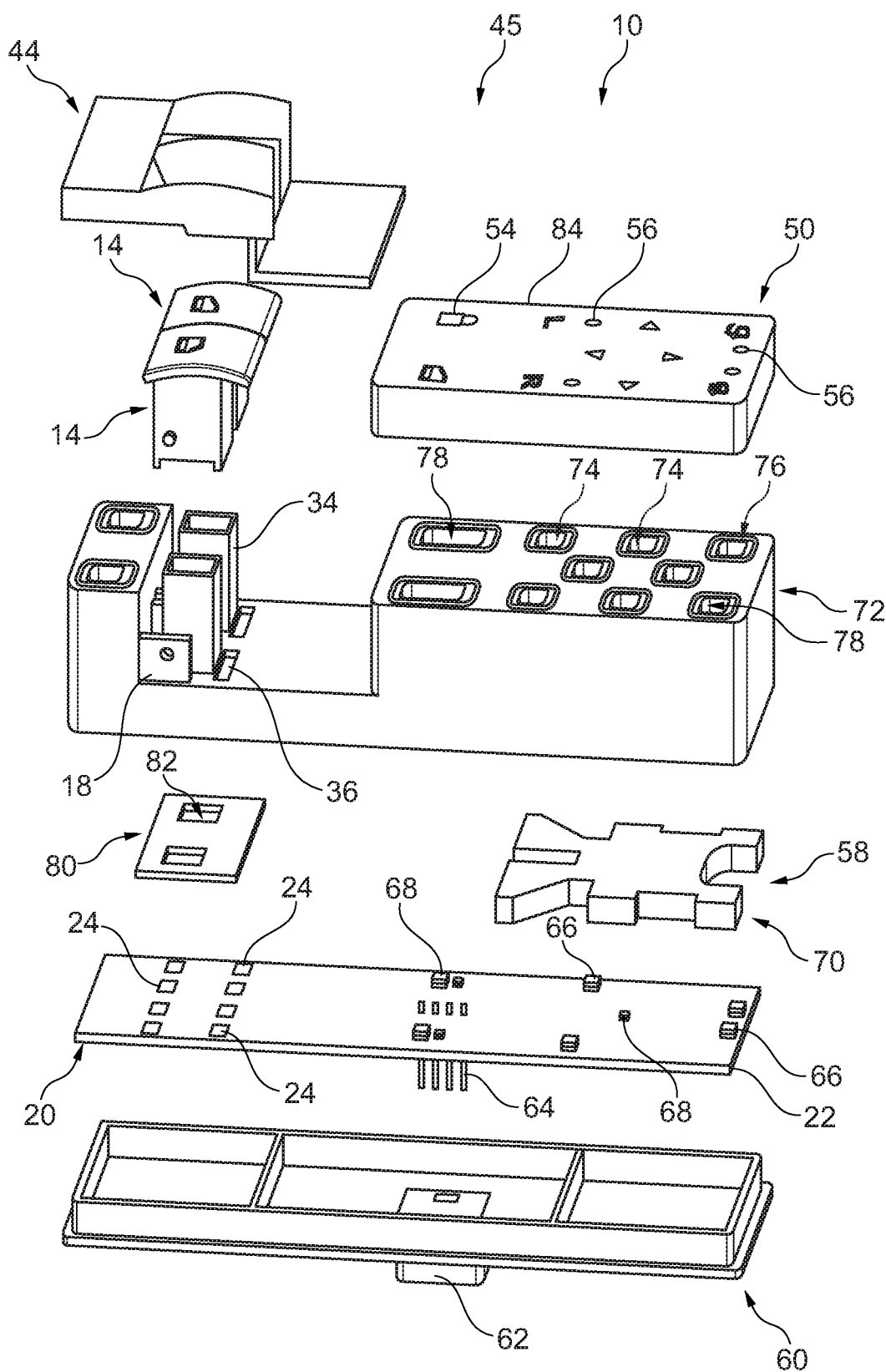
FIG. 10 shows an exploded view of the motor vehicle control device shown in FIG. 8.

FIG. 10 shows the motor vehicle control device 10 in an exploded view, which for example reveals the construction of the function display control areas 50.

The motor vehicle control device 10 comprises a covering element 60 which comprises a connector chamber 62 into which a plug can be put from outside, in order to contact contact pins 64 of the printed circuit board 22. In the assembled condition the contact pins 64 accordingly extend into the connector chamber 62. Via the plug, the motor vehicle control device 10 can emit control signals or be supplied with electric energy.

As explained already, the printed circuit board 22 includes several electrodes 24 which are associated to the control units 12. In addition, light sources 66 are provided on the printed circuit board 22, which in the illustrated embodiment are associated to the first function display control area 50, in particular to the corresponding light exit surfaces 56.

In addition, search illumination light sources 68 are provided on the printed circuit board 22, which cooperate with a light guide 70 which like the search illumination light sources 68 is part of the search illumination 58. When the search illumination 58 is activated, the search illumination tight sources 68 associated to the light guide 70 correspondingly are actuated, so that all switching symbols 54 on the display surface 52 are backlit. Thus, the vehicle occupant can quickly activate or deactivate the desired function, as it is easy to find.

The covering element 60 cooperates with a base module 72 formed as base body, on which among other things the bearing portions 18 as well as the guide pins 34 for the control elements 14 are formed.

The base module 72 comprises electrically conductive portions 74, which each include a sensor surface 76 associated to the display surface 52 of the function display control area 50, which substantially is parallel to the display surface 52. The sensor surfaces 76 each are arranged below the switching symbols 54, so that they can detect an approach to or touch of a corresponding switching symbol 54.

Figure 11:
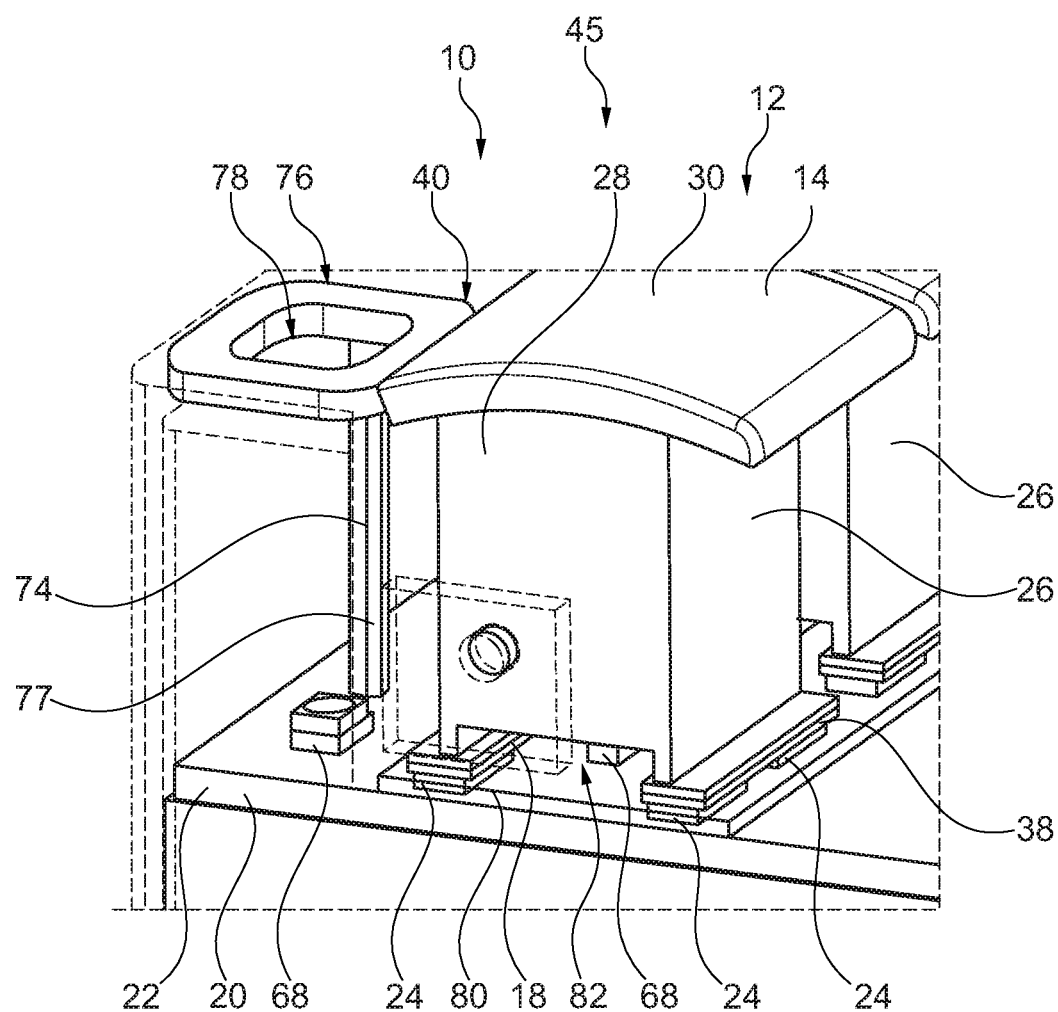
FIG. 11 shows a partly transparent representation of the motor vehicle control device shown in FIG. 8.

The electrically conductive portions 74 substantially extend through the base module 72, wherein the direction of extension is vertical to the display surface 52 or vertical to the sensor surfaces 76. This is illustrated in FIG. 11, in which it is shown how the sensor surface 76 is circumferentially formed in a plane, proceeding from which an electric line portion 77 integrated in the base module 72 extends in direction of the printed circuit board 22.

The electrically conductive portions 74 also are formed closed all around in one plane, in particular the corresponding sensor surfaces 76, wherein they enclose light ducts 78 through which the switching symbols 54 on the display surface 52 can be backlit.

Furthermore, an insulation element 80 is shown in this exploded view, which is formed plate-shaped, in particular a dielectric. The insulation element 80 is associated to the electrodes 24 of the control units 12, in order to form the capacitors 38 flipped open between the pairs of electrodes 24 and the control units 12, in particular between the corresponding resetting member 36 and the electrodes 24. The insulation element 80 also is provided in a corresponding way in the first embodiment.

In the insulation element 80 cutouts 82 likewise are provided, so that via non-illustrated light sources the switching symbols 54 on the control elements 14, in particular on the respective actuating portion 30, can be backlit. The light passes through the cutouts 82 and the hollow guide pins 34, so that it impinges on the respective actuating portion 30, in particular on its back. The actuating portions 30 consequently are formed at least partly transparent.

Due to the electrically conductive, closed surface 40 of the motor vehicle control device 10 it is possible that an approach of a control object to the motor vehicle control device 10, in particular to its surface 40, leads to the fact that the search illumination 58 is activated, so that the corresponding switching symbols 54 are backlit, whereby the same are easier to find.

As soon as the vehicle occupant touches one of the switching symbols 54, this is capacitively detected via the associated sensor surface 76, whereby the corresponding function is switched on or off. In case the corresponding function is switched on, the associated light source 66 is actuated such that it emits light, which exits on a light exit surface 56 associated to the actuated switching symbol 54. The vehicle occupant thereby recognizes which function is activated already.

Furthermore, it is shown that the entire surface 40 of the motor vehicle control device 10 is formed of four components, namely of the two control elements 14, the trim 44 and a trim 84 associated to the first function display control area 50.

The two trims 44, 84 in particular are formed of an electrically conductive material, so that a continuous electrically conductive surface 40 of the motor vehicle control device 10 is obtained, via which the approach to the surface 40 can be detected correspondingly.

In general, the trims 44, 84, the control elements 14 and the base module 72 can at least partly comprise an electrically conductive material, in order to provide the corresponding functionality, in particular the corresponding sensor system. The electrically conductive material can have been injected. In an inexpensive way, the trims 44, 84, the control elements 14 and the base module 72 have been manufactured by a two-component injection molding method.

It thus is possible to manufacture a motor vehicle control device 10 formed as window lifter module 45, which comprises a capacitive control unit 12, in a simple way.

The invention claimed is:

1. A motor vehicle control device, comprising:
a control unit, which includes a movable control element;
an electrode carrier including at least two electrodes associated with the control element, which are contacted electrically and together with the control unit to form a common capacitor; and
a resetting member which sets the control element back into its neutral position,
wherein the resetting member is arranged between the electrode carrier and the control element and is in direct physical contact with the electrode carrier and/or the control element, and
wherein the resetting member is electrically conductive and that the electric conductivity of the resetting member ensures that together with the electrodes it can form the common capacitor flipped open.

2. The motor vehicle control device according to claim 1, wherein the at least two electrodes and the control unit form the common capacitor flipped open.

3. The motor vehicle control device according to claim 1, wherein the control unit and the electrode carrier form at least one of a capacitive pressure sensor or a capacitive distance sensor.

4. The motor vehicle control device according to claim 1, wherein the control element comprises electrically conductive material.

5. The motor vehicle control device according to claim 1, wherein the control element is formed by a two-component injection molding method.

6. The motor vehicle control device according to claim 1, wherein the resetting member is elastic and/or electrically conductive.

7. The motor vehicle control device according to claim 1, wherein the control element is at least one of a rocker switch or toggle switch.

8. The motor vehicle control device according to claim 1, wherein the control element includes a pivot axis (A) which is shifted with respect to a center-of-gravity axis (S) of the control element, so that the pivot axis and the center-of-gravity axis do not intersect.

9. The motor vehicle control device according to claim 1, further comprising at least one further control area.

10. The motor vehicle control device according to claim 9, wherein the at least one further control area is formed as a capacitive sliding area.

11. The motor vehicle control device according to claim 9, wherein the at least one further control area is a capacitive function display control area which includes a display surface, wherein the capacitive function display control area is associated to a base module.

12. The motor vehicle control device according to claim 11, wherein the base module comprises at least one electrically conductive portion which extends through the base module, wherein the at least one electrically conductive portion has a sensor surface associated to the display surface, which forms at least a part of a capacitive sensor.

13. The motor vehicle control device according to claim 12, wherein the at least one electrically conductive portion is formed closed all around in one plane and surrounds a light duct which extends vertically through the at least one electrically conductive portion of the base module.

14. The motor vehicle control device according to claim 11, wherein a search illumination is associated to the display surface of the function display control area.

15. The motor vehicle control device according to claim 1, wherein the resetting member protects the electrode carrier.

16. The motor vehicle control device according to claim 1, wherein the resetting member partially covers the electrode carrier.

17. A motor vehicle control device, comprising:
a control unit, which includes a movable control element, wherein the control element is formed by a two-component injection molding method and one component is an electrically conductive material;
an electrode carrier including at least two electrodes associated with the control element, which are contacted electrically and together with the control unit to form a common capacitor; and
a switching symbol on an actuating portion of the control element,
wherein the switching symbol is backlit in that light impinges on a back of the actuating portion which is formed at least partly transparent.

18. A motor vehicle control device, comprising:
a control unit, which includes a movable control element;
an electrode carrier including at least two electrodes associated with the control element, which are contacted electrically and together with the control unit to form a common capacitor; and
at least one further control area,
wherein the at least one further control area is a capacitive function display control area which includes a display surface, wherein the capacitive function display control area is associated to a base module, wherein the base module includes electrically conductive portions, and the electrically conductive portions substantially extend through the base module, wherein a direction of extension is vertical to the display surface.

* * * * *